United States Patent
Yonemoto et al.

(10) Patent No.: US 10,591,550 B2
(45) Date of Patent: Mar. 17, 2020

(54) SECONDARY-BATTERY MONITORING DEVICE AND PREDICTION METHOD OF BATTERY CAPACITY OF SECONDARY BATTERY

(71) Applicant: HITACHI AUTOMOTIVE SYSTEMS, LTD., Ibaraki (JP)

(72) Inventors: Masahiro Yonemoto, Tokyo (JP); Youhei Kawahara, Tokyo (JP); Takeshi Inoue, Tokyo (JP); Keiichiro Ohkawa, Hitachinaka (JP)

(73) Assignee: VEHICLE ENERGY JAPAN INC., Ibaraki (JP)

( * ) Notice: Subject to any disclaimer, the term of this patent is extended or adjusted under 35 U.S.C. 154(b) by 489 days.

(21) Appl. No.: 15/310,586

(22) PCT Filed: Apr. 28, 2015

(86) PCT No.: PCT/JP2015/062855
§ 371 (c)(1),
(2) Date: Nov. 11, 2016

(87) PCT Pub. No.: WO2015/174279
PCT Pub. Date: Nov. 19, 2015

(65) Prior Publication Data
US 2017/0082694 A1    Mar. 23, 2017

(30) Foreign Application Priority Data

May 14, 2014  (JP) .................................. 2014-100741

(51) Int. Cl.
*G01R 31/382* (2019.01)
*G01R 31/367* (2019.01)
(Continued)

(52) U.S. Cl.
CPC .......... *G01R 31/382* (2019.01); *G01R 31/36* (2013.01); *G01R 31/367* (2019.01);
(Continued)

(58) Field of Classification Search
CPC ..... G01R 31/36; G01R 31/367; G01R 31/382
See application file for complete search history.

(56) References Cited

U.S. PATENT DOCUMENTS

2009/0276172 A1*  11/2009  Nishi ................... G01R 31/367
                                                        702/63
2011/0060538 A1*   3/2011  Fahimi ................. G01R 31/392
                                                        702/63
(Continued)

FOREIGN PATENT DOCUMENTS

JP    2013-089424 A    5/2013
WO    2012/150384 A1   11/2012

OTHER PUBLICATIONS

The extended European search report dated Dec. 8, 2017 for the European Application No. 15793347.4.
(Continued)

*Primary Examiner* — Kyle R Quigley
(74) *Attorney, Agent, or Firm* — Volpe and Koenig, P.C.

(57) ABSTRACT

A secondary-battery monitoring device includes: a use-state memory device that stores a transition of a load parameter indicating a use state of a secondary battery; and a battery capacity prediction device that predicts a temporal change of a battery capacity of the secondary battery on the basis of a prediction function. The prediction function is derived from a relation between growth of a film formed in an electrode surface of the secondary battery and a reduction of a precursor component of the film which is contained in an electrolyte of the secondary battery. The battery capacity prediction device determines a coefficient of the prediction function on the basis of the transition of the load parameter
(Continued)

which is stored in the use-state memory device, and predicts the temporal change of the battery capacity of the secondary battery on the basis of the prediction function which uses the coefficient.

5 Claims, 11 Drawing Sheets

(51) Int. Cl.
    *G01R 31/36*     (2020.01)
    *H02J 7/00*     (2006.01)
    *H01M 10/48*     (2006.01)
    *H01M 10/42*     (2006.01)

(52) U.S. Cl.
    CPC ....... *H01M 10/4285* (2013.01); *H01M 10/48* (2013.01); *H01M 10/486* (2013.01); *H02J 7/00* (2013.01); *H01M 2220/20* (2013.01)

(56) References Cited

U.S. PATENT DOCUMENTS

2013/0096858 A1     4/2013     Amano et al.
2014/0067297 A1     3/2014     Prada et al.

OTHER PUBLICATIONS

Harry J. Ploehn et al: "Solvent Diffusion Model for Aging of Lithium-Ion Battery Cells", Journal of the Electrochemical Society, vol. 151, No. 3, Jan. 31, 2004, p. A456 cited in the EESR.

X. Lin et al: "A Comprehensive Capacity Fade Model and Analysis for Li-Ion Batteries", Journal of the Electrochemical Society, vol. 160, No. 10, Jan. 31, 2013, pp. A1701-A1710 cited in the EESR.

Peng Rong et al: "An analytical model for predicting the remaining battery capacity of lithium-ion batteries", IEEE Transactions on Very Large Scale Integration Systems, IEEE Service Center, Piscataway, NJ, USA, vol. 14, No. 5, May 31, 2006, pp. 441-451 cited in the EESR.

\* cited by examiner

SECONDARY-BATTERY MONITORING DEVICE AND PREDICTION METHOD OF BATTERY CAPACITY OF SECONDARY BATTERY

TECHNICAL FIELD

The present invention relates to a secondary-battery monitoring device and a prediction method of a battery capacity of a secondary battery.

BACKGROUND ART

In an apparatus using a secondary battery as a power source (for example, an electric motor vehicle using the secondary battery as a power source of a vehicle traveling motor), it is important performing a process such as ascertaining a degradation state of the secondary battery with accuracy, and replacing the secondary battery before a defect caused by degradation occurs. PTL 1 discloses a prediction system as a device for detecting a capacity degradation state of the secondary battery for example. In PTL 1, a method of using a root method model is described as a method of predicting the capacity degradation state.

CITATION LIST

Patent Literature

PTL 1: JP 2013-089424 A

SUMMARY OF INVENTION

Technical Problem

However, in the root method model used in the prediction system described in PTL 1 above, it is difficult to predict a capacity degradation behavior for a long time with accuracy.

Solution to Problem

According to an aspect of the present invention, a secondary-battery monitoring device includes: a use-state memory device that stores a transition of a load parameter indicating a use state of a secondary battery; and a battery capacity prediction device that predicts a temporal change of a battery capacity of the secondary battery on the basis of a prediction function, wherein the prediction function is a function derived from a relation between a growth of a film which is formed in an electrode surface of the secondary battery, and a reduction of a precursor component of the film which is contained in an electrolyte of the secondary battery, and wherein the battery capacity prediction device determines a coefficient of the prediction function on the basis of the transition of the load parameter which is stored in the use-state memory device, and predicts the temporal change of the battery capacity of the secondary battery on the basis of the prediction function which uses the coefficient.

According to another aspect of the present invention, a prediction method of a battery capacity of a secondary battery includes: using a prediction function of the battery capacity of the secondary battery, the prediction function being derived from a relation between a growth of a film formed in an electrode surface of the secondary battery and a reduction of a precursor of the film contained in an electrolyte of the secondary battery; determining a coefficient of the prediction function on the basis of a transition of a load parameter indicating a use state of the secondary battery; and predicting a temporal change of the battery capacity of the secondary battery on the basis of the prediction function using the coefficient.

ADVANTAGEOUS EFFECTS OF INVENTION

According to the invention, it is possible to predict a temporal change of a battery capacity of a secondary battery with accuracy.

DESCRIPTION OF EMBODIMENTS

First Embodiment

Herein, a first embodiment of the invention will be described with reference to the drawings. In the following embodiment, a battery system of a power source of a hybrid electric vehicle (HEV) will be described using an example in a case where the invention is applied.

Further, in the following embodiment, single batteries are connected in series to form a battery pack. However, the single batteries connected in parallel may be connected in series to form the battery pack, or the single batteries connected in series may be connected in parallel to form the battery pack. In addition, only one single battery may be used to form the battery pack.

Figure 1:
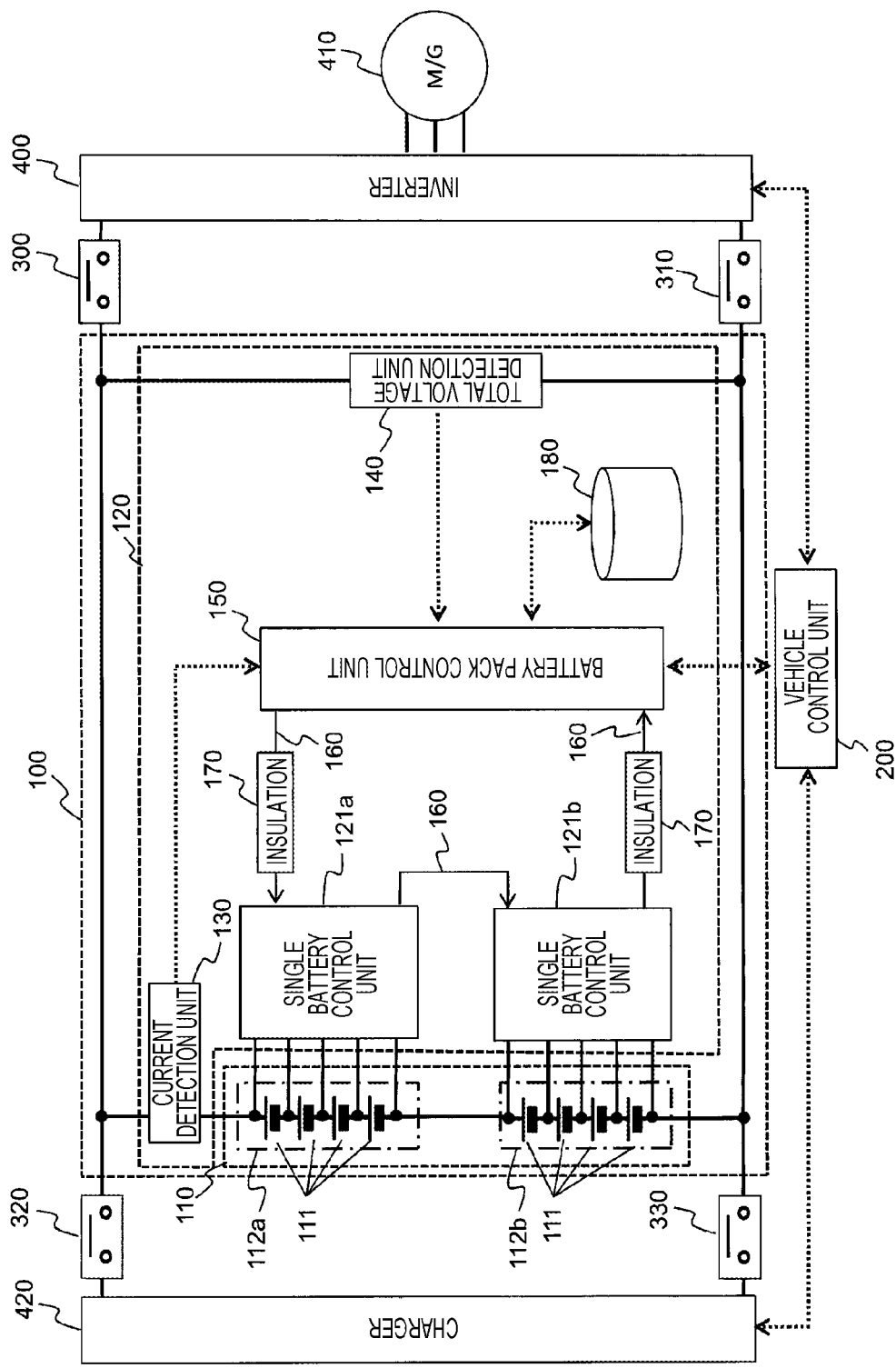
FIG. 1 is a diagram illustrating a battery system containing a battery control system according to a first embodiment and a peripheral configuration.

FIG. 1 is a diagram illustrating a battery system 100 containing a battery control system 120 according to the first embodiment of the invention and a peripheral configuration.

The battery system 100 is connected to an inverter 400 through relays 300 and 310. The battery system 100 includes a battery pack 110 and the battery control system 120. The battery control system 120 includes single battery control units 121a and 121b, a current detection unit 130, a total voltage detection unit 140, a battery pack control unit 150, and a memory unit 180.

The battery pack 110 is configured by connecting single-battery groups 112a and 112b in series, each of which is configured by a plurality of single batteries (battery cells) 111. The single battery control units 121a and 121b are connected to the single-battery groups 112a and 112b respectively, detect a cell voltage (voltage across both terminals) and a temperature of each single battery 111 of these single-battery groups, and transmit a signal indicating the detection result to the battery pack control unit 150 through a signal channel 160 and an insulating element 170. Further, a photocoupler is used as the insulating element 170 for example.

The current detection unit 130 detects a current flowing to each of the single batteries 111 connected in series in the battery pack 110 and measures a current value. The total voltage detection unit 140 detects the voltage across both terminals of the battery pack 110 (that is, a total voltage of the single batteries 111 connected in series in the battery pack 110).

The battery pack control unit 150 acquires the cell voltage and the temperature of each single battery 111 on the basis of the signal transmitted from the single battery control units 121a and 121b. In addition, the value of the current flowing to the battery pack 110 is acquired from the current detection unit 130, and a total voltage value of the battery pack 110 is acquired from the total voltage detection unit 140. The battery pack control unit 150 detects a state of the battery pack 110 on the basis of the information. The state of the battery pack 110 detected by the battery pack control unit 150 is transmitted to the single battery control units 121a and 121b and a vehicle control unit 200.

The battery pack 110 is configured by electrically connecting one or more single batteries 111 in series which can be charged or discharged with electric energy (charging/discharging of DC power). A predetermined number of single batteries 111 of the battery pack 110 are divided into groups in order to manage/control the state. The grouped single batteries 111 are electrically connected in series, and form the single-battery groups 112a and 112b. Further, the number of single batteries 111 of the single-battery group 112 may be the same in all the single-battery groups 112. Alternatively, the number of single batteries 111 may be different at every single-battery group 112. In this embodiment, to simplify the description below, four single batteries 111 are electrically connected in series to form each of the single-battery groups 112a and 112b, and these single-battery groups 112a and 112b are further electrically connected in series as illustrated in FIG. 1, so that total eight single batteries 111 are included in the battery pack 110.

Further, each single battery 111 of the battery pack 110 is provided with an explosion-proof mechanism for preventing a voltage rising by blocking the current in a case where the single battery is overcharged and increased in voltage.

Herein, the description will be made about a method of communicating between the battery pack control unit 150 and the single battery control units 121a and 121b. The single battery control units 121a and 121b are connected in series in a descending order of potentials of the monitoring single-battery groups 112a and 112b. A signal transmitted from the battery pack control unit 150 is input to the single battery control unit 121a through the insulating element 170 and the signal channel 160. The output of the single battery control unit 121a is input to the single battery control unit 121b through the signal channel 160. The output of the single battery control unit 121b at the lowest potential is transmitted to the battery pack control unit 150 through the insulating element 170 and the signal channel 160. Further, in this embodiment, there is no insulating element provided between the single battery control unit 121a and the single battery control unit 121b, but the signal also may be transmitted or received therebetween through the insulating element.

The memory unit 180 is a memory element which can read various types of information according to control of the battery pack control unit 150. For example, a nonvolatile memory medium such as EEPROM (Electrically Erasable Programmable Read Only Memory) or flash memory is used to form the memory unit 180. In the memory unit 180, various types of information related to the state of each single battery 111 of the battery pack 110 are stored as information for the battery pack control unit 150 to perform the control of the battery pack 110. For example, information related to a state of charge (SOC) of the single battery 111 and information related to an inner resistance of each single battery 111 are stored in the memory unit 180. In addition, the memory unit 180 stores a cumulated deterioration amount which is calculated on the basis of a load history such as a current flowing to each single battery 111, an ambient temperature, and the SOC. Further, the cumulated deterioration amount will be described in detail below.

The battery pack control unit 150 performs various types of processes and calculations to control the battery pack 110 using information acquired from the single battery control units 121a and 121b, the current detection unit 130, the total voltage detection unit 140, and the vehicle control unit 200, and using information stored in the memory unit 180. For example, a calculation of the SOC and a state of health (SOH) of each single battery 111 of the battery pack 110, a calculation of an allowable power which can be charged or discharged in the battery pack 110, a determination on an abnormal state of the battery pack 110, and a calculation for controlling the amount of charging/discharging of the battery pack 110 are performed. Then, information necessary for the control of the battery pack 110 is output to the single battery control units 121a and 121b and the vehicle control unit 200 on the basis of these calculation results. Further, the battery pack control unit 150 and the vehicle control unit 200 each are connected to a communication network (called CAN (Controller Area Network)) in the vehicle, and can transmit and receive the information to each other.

The vehicle control unit 200 controls the inverter 400 which is connected to the battery system 100 through the relays 300 and 310 using the information transmitted from the battery pack control unit 150. During the traveling of the vehicle, the battery system 100 is connected to the inverter 400. The inverter 400 drives a motor generator 410 using energy accumulated in the battery pack 110 in the battery system 100.

In a case where a vehicle system equipped with the battery system 100 is activated, the battery system 100 is connected to the inverter 400 for the management of the vehicle control unit 200. Then, the motor generator 410 is driven by the inverter 400 using the energy accumulated in the battery pack 110. On the other hand, the battery pack 110 is charged with power generated by the motor generator 410 at the time of regenerating power.

When the battery system 100 is connected to a charger 420 through relays 320 and 330, the battery pack 110 is charged by a charging current supplied from the charger 420 until a predetermined condition is satisfied. The energy accumulated in the battery pack 110 through the charging is used at the next traveling time of the vehicle and also used to operate interior or exterior electric equipment of the vehicle. Furthermore, the energy may be discharged to an external power source represented by a household power source as needed. Further, the charger 420 is mounted in the household power source or an external power source represented by an electric station. When the vehicle mounted with the battery system 100 is connected to these power sources, the battery system 100 and the charger 420 are connected on the basis of the information transmitted by the vehicle control unit 200.

Figure 2:
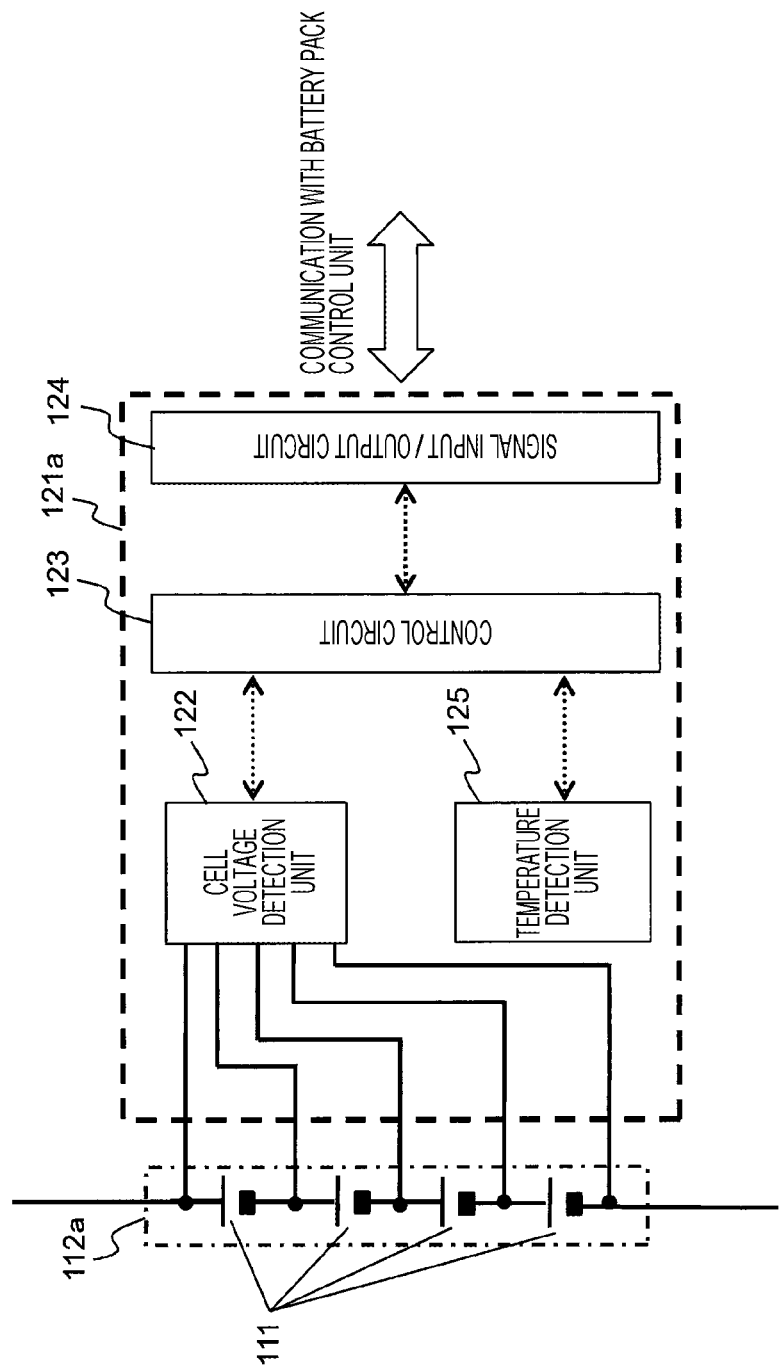
FIG. 2 is a diagram illustrating a circuit configuration of a single battery control unit.

FIG. 2 is a diagram illustrating a circuit configuration of the single battery control unit 121a. As illustrated in FIG. 2, the single battery control unit 121a includes a cell voltage detection unit 122, a control circuit 123, a signal input/output circuit 124, and a temperature detection unit 125. Further, the single battery control unit 121a and the single battery control unit 121b of FIG. 1 have the similar circuit configuration. Therefore, a circuit configuration of the single battery control unit 121a is illustrated in FIG. 2 on behalf of these units.

The cell voltage detection unit 122 measures the cell voltage (voltage across both terminals) of each single battery 111. The control circuit 123 acquires the measured result from the cell voltage detection unit 122 and the temperature detection unit 125, and transmits the result to the battery pack control unit 150 through the signal input/output circuit 124. Further, while not illustrated in FIG. 2, the single battery control unit 121a is provided with a well-known circuit configuration for equalizing voltages between the single batteries 111 generated due to self-discharging or a deviation in current consumption, and for equalizing a deviation in the SOC. The operation of this circuit is controlled by the control circuit 123.

In FIG. 2, the temperature detection unit 125 has a function of measuring the temperature of the single-battery group 112a. The temperature detection unit 125 measures the temperature of one single battery of the entire single-battery group 112a, and uses the temperature as a representative temperature value of each single battery 111 of the single-battery group 112a. The temperature measurement result of the temperature detection unit 125 is used in various types of calculations in the battery pack control unit 150 for detecting the states of the single battery 111, the single-battery group 112a, and the battery pack 110. At this time, the temperature measured by the temperature detection unit 125 is used not only as the temperature of each single battery 111 of the single-battery group 112a but also as the temperature of the single-battery group 112a. Furthermore, the battery pack control unit 150 may obtain the temperature of the battery pack 110 by averaging the temperature of the single-battery group 112a measured by the temperature detection unit 125 of the single battery control unit 121a and the temperature of the single-battery group 112b measured by the temperature detection unit 125 of the single battery control unit 121b.

Further, FIG. 2 illustrates an example in which one temperature detection unit 125 is provided in the single battery control unit 121a. Otherwise, the temperature detection unit 125 may be provided in every single battery 111 to measure the temperature of each single battery 111, and the battery pack control unit 150 may perform various types of calculations on the basis of the measurement results. However, in such a case, the configuration of the single battery control unit 121a becomes complicated as the number of temperature detection units 125 is increased. Alternatively, one temperature detection unit 125 may be provided with respect to the entire battery pack 110.

Further, the temperature detection unit 125 is simplified as one block in FIG. 2, but in practice a temperature sensor is provided for the single-battery group 112a which is a temperature measuring target, and outputs the temperature information as a voltage signal. The temperature of the single-battery group 112a is calculated by the control circuit 123 on the basis of the voltage signal so as to obtain a temperature measurement result of the single-battery group 112a. When the temperature measurement result calculated by the control circuit 123 is transmitted to the signal input/output circuit 124, the signal input/output circuit 124 outputs the temperature measurement result to the outside of the single battery control unit 121a. A function of realizing a series of flows is mounted as the temperature detection unit 125 in the single battery control unit 121a. Further, the measurement of the voltage signal output from the temperature sensor may be performed by the cell voltage detection unit 122.

Figure 3:
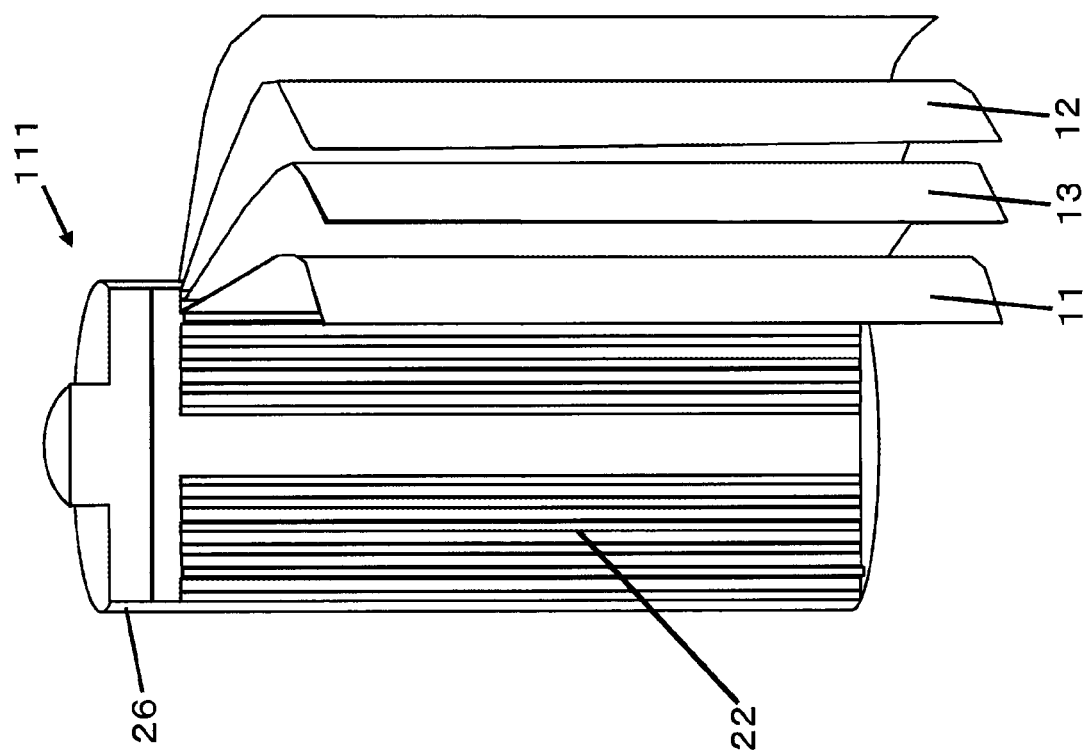
FIG. 3 is a diagram schematically illustrating a structure of a single battery.

FIG. 3 illustrates the single battery 111 which is used in this embodiment. The single battery 111 of this embodiment is a cylindrical lithium-ion secondary battery which uses a carbon negative electrode. A positive electrode plate 11 containing a combined lithium oxide as an active material and an negative electrode plate 12 containing a lithium-ion-holding material as the active material are spirally wound with a separator 13 interposed therebetween, so that an electrode winding group 22 is manufactured. The electrode winding group 22 is contained in a battery housing 26 of the single battery 111 together with a predetermined electrolytic solution.

As a positive electrode active material coated on the positive electrode plate 11, there may be exemplified a lithium cobalt oxide and a modification body thereof (obtained by dissolving aluminum and magnesium in the lithium cobalt oxide), lithium nickelate and a modification body thereof (obtained by substituting part of nickel into cobalt), lithium manganate and a modification body thereof, and their compound oxides (nickel, cobalt, manganese, ion, aluminum, molybdenum, etc.). In addition, an olivine-based compound and a lithium manganese compound of a spinel type structure may be used alone, and an oxide obtained by compounding the above compounds may be used.

As a conductive material for the positive electrode, for example, carbon black such as acetylene black, ketjen black, channel black, furnace black, lamp black, and thermal black, or various types of graphite may be used alone, or a conductive material obtained by compounding the above carbons may be used.

As a binder for the positive electrode, for example, polyvinylidene fluoride (PVdF), a modification body of polyvinylidene fluoride, polytetrafluoroethylene (PTFE), and a rubber particle binder having an acrylate unit may be used. At this time, an acrylic mono-rate monomer introducing a reactive functional group, or an acrylate oligomer may be mixed in the binder.

Next, as an negative electrode active material coated on the negative electrode plate 12, various types of natural graphite, artificial graphite, a silicon-based composite material such as silicide, and various types of metal plastic materials may be used, or a material obtained by mixing amorphous carbon (hardly graphitizable carbon and easily graphitizable carbon) into natural graphite, artificial graphite, silicon-based composite material, and various types of metal plastic materials may be used.

As a binder for the negative electrode, various types of binder may be used including PVdF and a modification body thereof. However, from the viewpoint of improving acceptability of the lithium ions, cellulose resin including carboxymethyl cellulose (CMC) is desirably combined to styrene-butadiene copolymer (SBR) and a modification body thereof, or added in a small quantity.

At this time, as a conductive material for the negative electrode, for example, carbon black such as acetylene black, ketjen black, channel black, furnace black, lamp black, and thermal black, or various types of graphite may be used alone, or a conductive material obtained by compounding the above carbons may be used.

The separator is not limited as long as the material is endurable in a usage range of the lithium-ion secondary battery, and a polyolefin-based microporous film such as polyethylene and polypropylene is generally used in a single or complex layers, and is desirable for implementation. A thickness of the separator is not limited, but desirably 10 to 40 μm.

Regarding the electrolytic solution, various types of lithium compounds such as LiPF6 and LiBF4 may be used as an electrolyte salt. In addition, ethylene carbonate (EC), dimethyl carbonate (DMC), and diethyl carbonate (DEC) may be used alone as a solvent, or may be used by combination thereof. In addition, a preferable film is formed on the positive electrode and the negative electrode, vinylene carbonate (VC), cyclohexylbenzene (CHB), and a modification body thereof may be desirably used in order to guarantee stability at the time of overcharging.

A shape of the electrode winding group in this embodiment may be a right cylindrical shape of which the cross section is a right circle, a long cylindrical shape of which the cross section is an elliptic shape, or an angulated pillar shape of which the cross section is a rectangular shape.

In addition, the battery housing in which the electrode winding group is filled is not particularly limited, but preferably a housing excellent in strength, corrosion resistance and workability (for example, a battery housing in which the steel is subjected to plating for corrosion resistance, and a battery housing made of a stainless steel). In addition, an aluminum alloy and various types of engineering plastics may be employed together with metal.

In this embodiment, the battery pack control unit 150 predicts a life span of each single battery 111 (that is, a reduction of capacity) as described below. Then, information of the predicted result on the life span of each single battery 111 in the battery pack control unit 150 is stored in the memory unit 180 for example. The information of the predicted result on the life span of each single battery 111 stored in the memory unit 180 is read through the battery pack control unit 150 and the vehicle control unit 200, and displayed in a display device (not illustrated) mounted in the vehicle. In addition, the information of the predicted result on the life span of each single battery 111 stored in the memory unit 180 is output through the battery pack control unit 150 and the vehicle control unit 200 to a diagnosis device (not illustrated) connected to the vehicle at a maintenance service center at the time of maintaining the vehicle for example.

Derivation of Capacity Degradation Function for Predicting Life Span

It is considered that a growth of SEI film (a solid-electrolyte interface film) generated by a side reaction in the negative electrode surface is a main factor of degradation of a lithium-ion battery using a carbon negative electrode. Therefore, the battery capacity is reduced in proportion to an increase of a thickness of the SEI film. In the conventional deterioration model, the thickness of the SEI film is considered to be in proportion to a square root of a battery use time. This model is a capacity deterioration model called "root-t method".

In the root-t method, a physical model is assumed in which an SEI precursor concentration $g(t)$ in the electrolytic solution is always constant ($g(t)=g0$), the SEI precursor in the electrolytic solution is diffused in the SEI film and reaches the negative electrode surface, and a formation reaction of the SEI film occurs. In the physical model, a growth speed $D'(t)$ of a film thickness $D(t)$ is in proportion to the SEI precursor concentration $g(t)$ in the electrolytic solution, and is in inverse proportion to the film thickness $D(t)$ as shown in Equation (1). In Equation (1), $\alpha$ is a proportional coefficient which varies a battery specification (electrolytic solution composition, electrolytic solution amount, positive electrode material, negative electrode material, electrode coating condition, etc.) and a load parameter (temperature, SOC, current, etc.).

[Equation 1]
$$D'(t) = \frac{dD(t)}{dt} = \alpha \times \frac{g(t)}{D(t)} \quad (1)$$

When a differential equation of Equation (1) is solved on an assumption that the SEI precursor concentration in the electrolytic solution is constant ($g(t)=g0$), the film thickness $D(t)$ becomes a function which is in proportion to a square root of time as shown in Equation (2).

[Equation 2]
$$D(t)=\sqrt{2 \times \alpha \times g_0 \times t} \quad (2)$$

In a case where a battery capacity $Q(t)$ is reduced in proportion to an increased amount of the film thickness $D(t)$, the battery capacity $Q(t)$ is expressed as Equation (3). In Equation (3), $\gamma$ is a proportional coefficient corresponding to the film thickness $D(t)$ and a reduced capacity, and varies depending on the battery specification (electrolytic solution composition, electrolytic solution amount, positive electrode material, negative electrode material, electrode coating condition, etc.). Equation (3) is a function which is expressed by the root-t method.

[Equation 3]
$$Q(t)=Q_{max,ini}-\gamma \times D(t) \quad (3)$$

Next, a physical model of an improved deterioration function proposed in the invention will be described. This physical model is a physical model in which the SEI precursor in the electrolytic solution reacts in the electrode surface so as to generate the SEI film and to be grown similarly to the root-t method. In the conventional root-t method, the SEI precursor concentration $g(t)$ in the electrolytic solution is assumed to be constant in time. However, since the SEI precursor is consumed as much as the SEI film is grown, the SEI precursor concentration $g(t)$ in the electrolytic solution is reduced and expressed as Equation (4). In the improved deterioration function proposed in the invention, a temporal variation of the SEI precursor concentration $g(t)$ is modeled. In Equation (4), $\beta$ is a proportional coefficient corresponding to an increase of $D(t)$ and a reduction of $g(t)$, and varies depending on the battery specification (electrolytic solution composition, electrolytic solution amount, positive electrode material, negative electrode material, electrode coating condition, etc.).

[Equation 4]

$$g(t) = g_0 - \beta \times D(t) \quad (4)$$

Equation (4) is substituted into Equation (1) and reformed to obtain Equation (8).

[Equation 5]

$$\frac{dD(t)}{dt} = \alpha \times \frac{g_0 - \beta \times D(t)}{D(t)} \quad (5)$$

[Equation 6]

$$dt = \frac{D(t)}{\alpha \times g_0 - \alpha \times \beta \times D(t)} \times dD(t) \quad (6)$$

[Equation 7]

$$dt = \left( \frac{g_0}{\alpha \times \beta \times g_0 - \alpha \times \beta^2 \times D(t)} - \frac{1}{\alpha \times \beta} \right) \times dD(t) \quad (7)$$

[Equation 8]

$$dt = \left( \frac{\frac{g_0}{\alpha \times \beta^2}}{\frac{g_0}{\beta} - D(t)} - \frac{1}{\alpha \times \beta} \right) \times dD(t) \quad (8)$$

Both sides of Equation (8) are integrated to obtain Equation (10).

[Equation 9]

$$t = -\frac{g_0}{\alpha \times \beta^2} \times \ln\left( \frac{g_0}{\beta} - D(t) \right) + \frac{g_0}{\alpha \times \beta^2} \times \ln\left( \frac{g_0}{\beta} \right) - \frac{D(t)}{\alpha \times \beta} \quad (9)$$

[Equation 10]

$$t = \frac{g_0}{\alpha \times \beta^2} \times \left( -\ln\left( 1 - \frac{\beta \times D(t)}{g_0} \right) - \frac{\beta \times D(t)}{g_0} \right) \quad (10)$$

While being shown by an initial capacity $Q_{max,ini}$ and the film thickness $D(t)$, the battery capacity $Q(t)$ is expressed as a dimensionless function $X(t)$ standardized using the initial capacity $Q_{max,ini}$ as shown in Equation (11).

[Equation 11]

$$Q(t) = Q_{max,ini} - \gamma \times D(t) = Q_{max,ini} - Q_{max,ini} \times X(t) \quad (11)$$

Equation (12) is obtained by substituting the relation between $D(t)$ and $X(t)$ obtained from Equation (11) into Equation (10). Further, the left side of Equation (12) is denoted as "t" for the convenience of expression.

[Equation 12]

$$t = \frac{g_0}{\alpha \times \beta^2} \times \left( -\ln\left( 1 - \frac{\beta \times Q_{max,ini} \times X(t)}{g_0 \times \gamma} \right) - \frac{\beta \times Q_{max,ini} \times X(t)}{g_0 \times \gamma} \right) \quad (12)$$

If Equation (12) is collectively arranged in its coefficients as denoted in Equations (13) and (14), Equation (15) is obtained. In Equation (15), A and τ are coefficients obtained by substituting constant terms made of α, β, γ, g0, and $Q_{max,ini}$ for the simplification. At this time, the coefficient A varies depending on the battery specification (the electrolytic solution composition, the electrolytic solution amount, positive electrode material, negative electrode material, electrode coating condition, etc.), and does not vary depending on the load parameter. In addition, the coefficient τ varies depending on the battery specification (the electrolytic solution composition, the electrolytic solution amount, positive electrode material, negative electrode material, electrode coating condition, etc.) and the load parameter (temperature, SOC, current, etc.).

[Equation 13]

$$A = \frac{g_0 \times \gamma}{\beta \times Q_{max,ini}} \quad (13)$$

[Equation 14]

$$\tau = \frac{g_0}{\alpha \times \beta^2} \quad (14)$$

[Equation 15]

$$\frac{t}{\tau} = -\ln\left( 1 - \frac{X(t)}{A} \right) - \frac{X(t)}{A} \quad (15)$$

Figure 4:
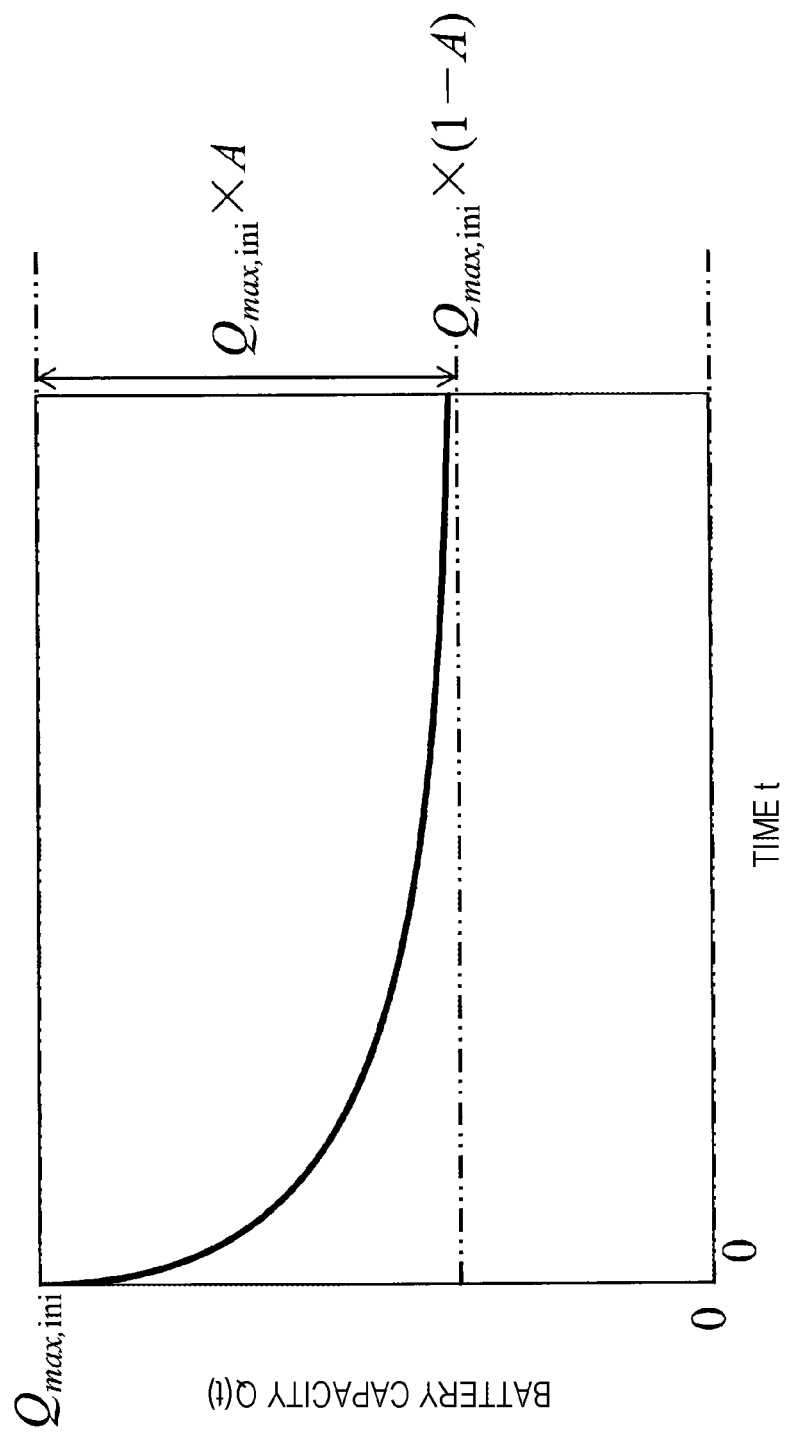
FIG. 4 is a graph illustrating behavior of a battery capacity function Q(t) over time.

Hitherto, the description has been made about formulation of the physical model in which the temporal change of the concentration g(t) of the SEI precursor in the electrolytic solution is considered. According to this deterioration model, the battery capacity function Q(t) is reduced in proportion to X(t) as illustrated in Equations (15) and (11). As temporal behavior of Q(t), the capacity is reduced from the initial capacity Qmax,ini as illustrated in FIG. 4, and is expressed as a function converged to Qmax,ini×(1-A).

Accuracy in Battery Capacity Prediction by Capacity Degradation Function

Figure 5:
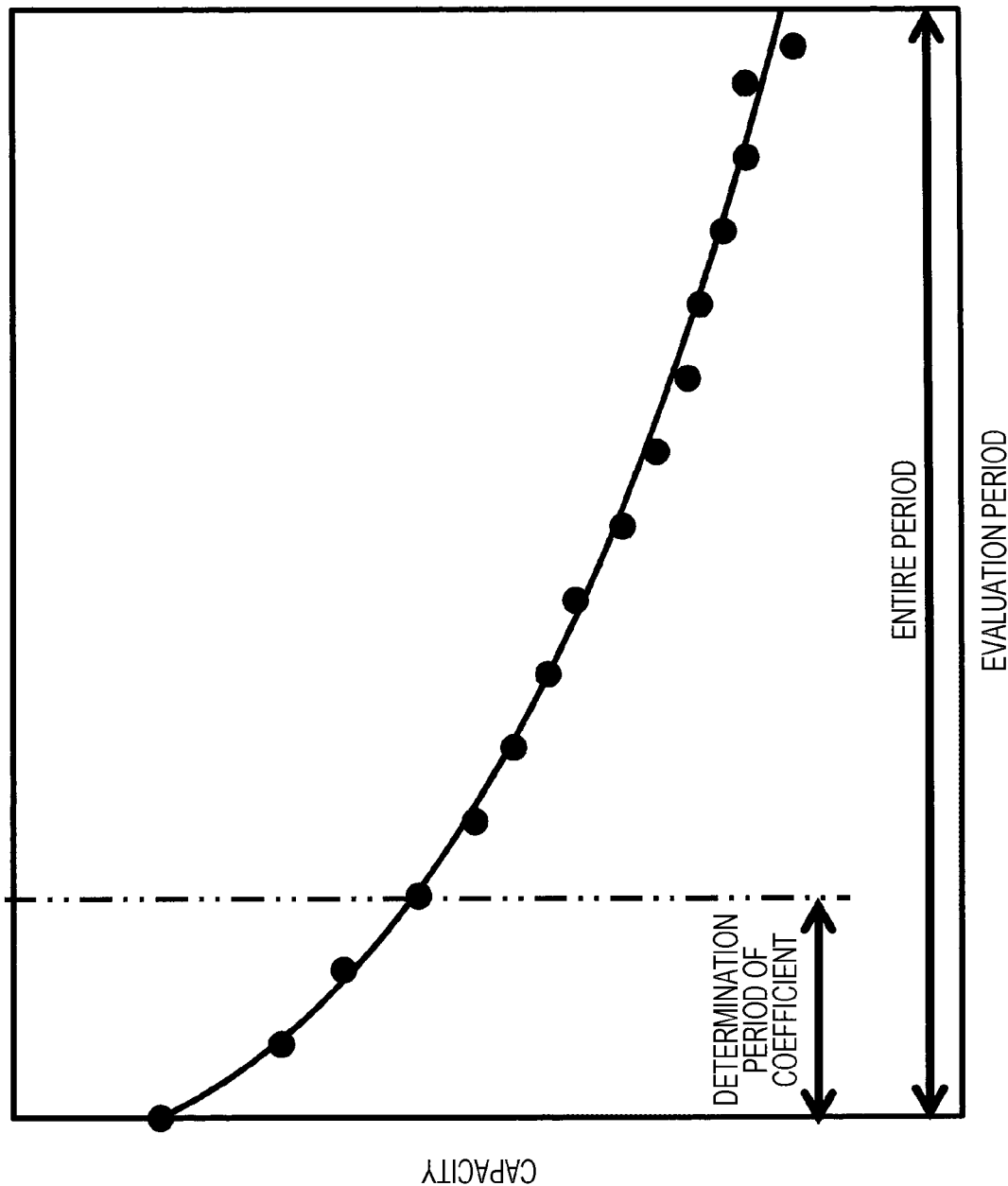
FIG. 5 is a graph in which a measured value of a temporal change of a battery capacity of the single battery on a predetermined load condition is plotted together with a prediction curve of the battery capacity by a capacity degradation function.

The description will be made about an error of prediction on the battery capacity by the capacity degradation function calculated as described above. FIG. 5 is a graph in which a measured value of a temporal change of the battery capacity of the single battery 111 on a predetermined load condition is plotted together with a prediction curve of the battery capacity by the capacity degradation function. In FIG. 5, the temporal change of the battery capacity of the single battery 111 on the predetermined load condition is measured and plotted over an entire period of evaluating the accuracy in the battery capacity prediction.

The graph depicted with the solid line in FIG. 5 represents the prediction curve of the battery capacity by the capacity degradation function of Equation (15). In the calculation of the prediction curve, a ⅕ period of the entire period of evaluating the accuracy in the battery capacity prediction is set as a determination period of the coefficient. Then, a fitting is performed such that the square sum of an error of the predicted value by the capacity degradation function of Equation (15) with respect to the plot of the measured value in the determination period is minimized, and the coefficients A and τ are determined. As illustrated in FIG. 5, even when the coefficients A and τ are determined on the basis of the data of the measured value in the ⅕ period of the entire evaluation period, there shows a matching between the prediction curve of the battery capacity and the measured value of the battery capacity over the entire evaluation period.

Figure 6:
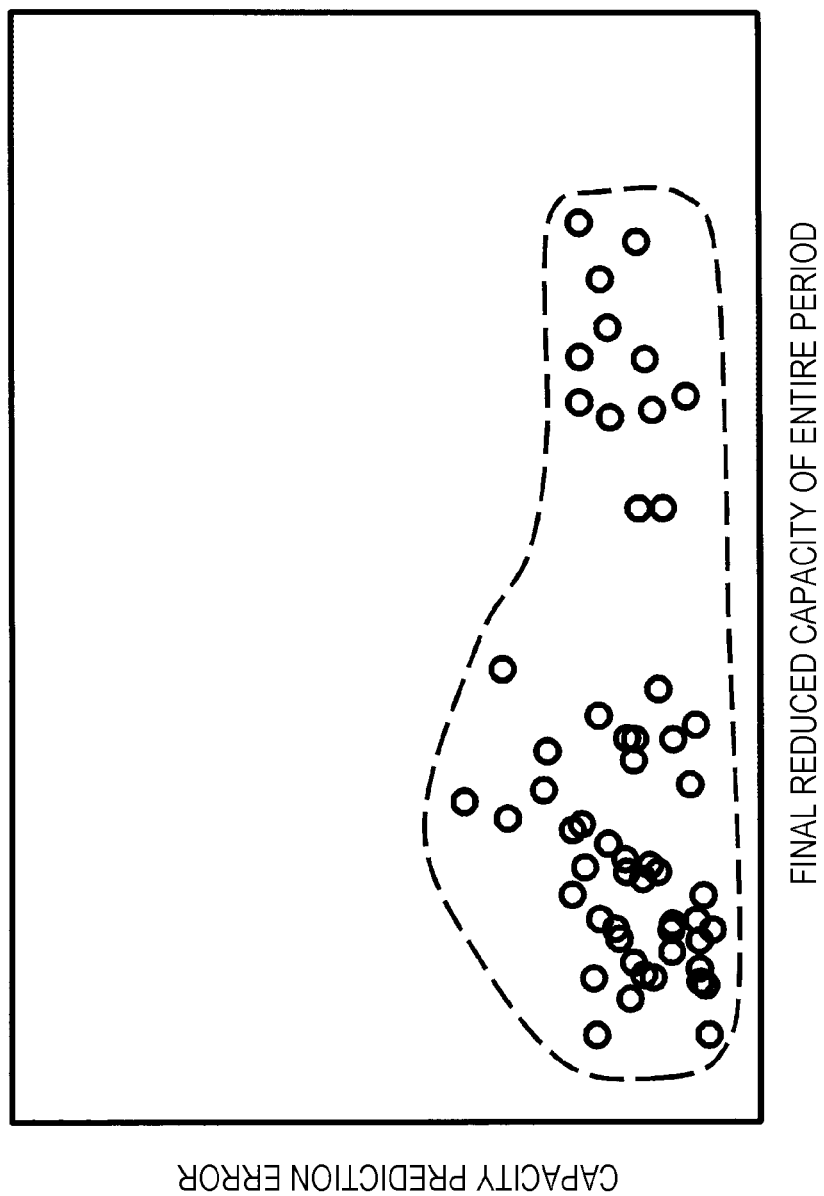
FIG. 6 is a graph illustrating a difference between a reduced amount of capacity of the single battery after the entire evaluation period is over and a predicted value based on the capacity degradation function.

In addition, FIG. 6 is a graph illustrating a difference between a reduced amount of the capacity of the single battery 111 after the entire evaluation period and the predicted value by the capacity degradation function of this embodiment. The horizontal axis of FIG. 6 represents the reduced amount (hereinafter, referred to as "final reduced capacity of the entire period") of the single battery 111 after the entire evaluation period, which is a difference between the initial capacity of the single battery 111 and the capacity of the single battery 111 after the entire evaluation period. The vertical axis of FIG. 6 represents a difference between the final reduced capacity of the entire period and the predicted value by the capacity degradation function of Equation (15) (hereinafter, referred to as "capacity prediction error"). Further, in FIG. 6, the coefficients A and τ are determined by setting the entire period of evaluating the accuracy of the battery capacity prediction as the determination period of the coefficient.

As illustrated in FIG. 6, in a case where the battery capacity is predicted by the capacity degradation function of Equation (15), the capacity prediction error falls within a constant range regardless of the magnitude of the final reduced capacity of the entire period.

Figure 7:
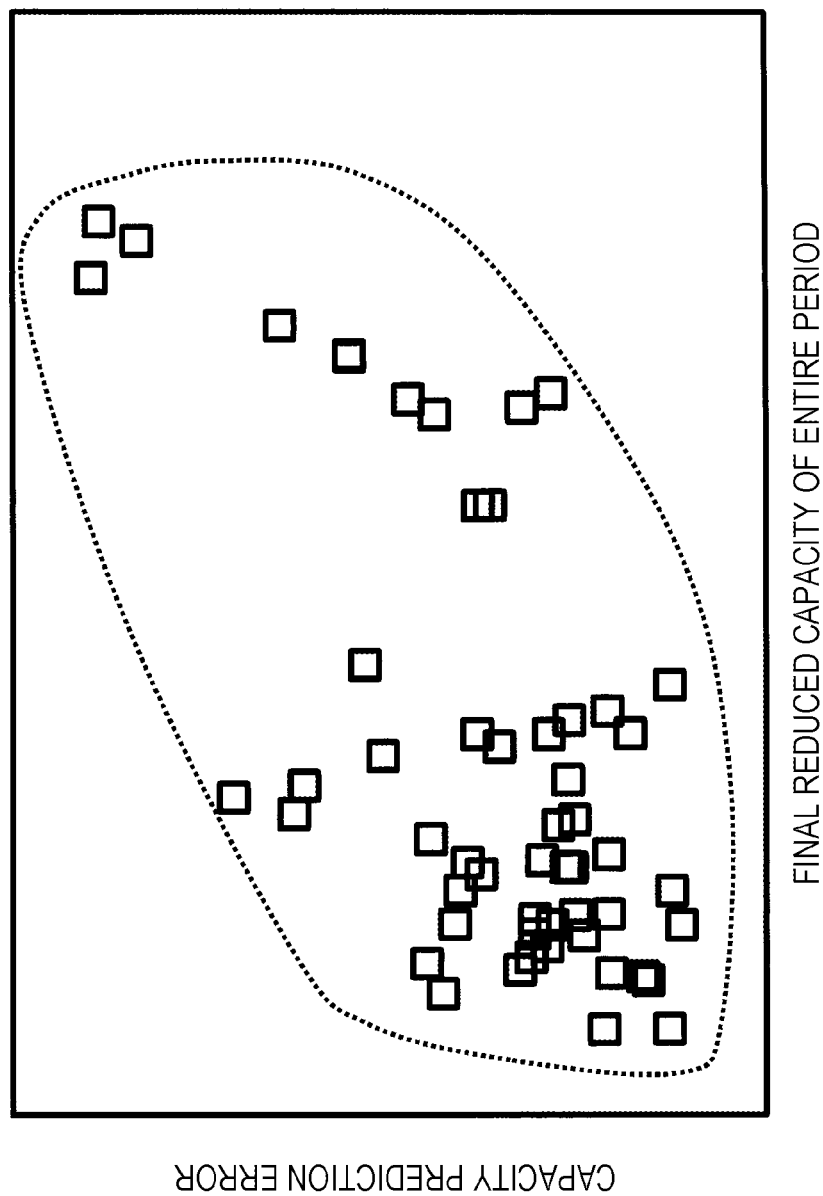
FIG. 7 is a graph illustrating a difference between the reduced amount of capacity of the single battery after the entire evaluation period is over and the predicted value of capacity based on the conventional root-t method.

FIG. 7 is a graph illustrating a difference between the reduced amount of the capacity of the single battery 111 after the entire evaluation period and the predicted value of the capacity based on the conventional root-t method. In each plot of FIG. 7, the predicted value of the battery capacity is calculated using the following Equation (16) based on the conventional root-t method. Further, in the following Equation (16), a coefficient k is a coefficient determined by performing a fitting such that the square sum of the error of the predicted value by Equation (16) with respect to the measured value of the entire period of evaluating the accuracy of the battery capacity prediction is minimized. In addition, a coefficient a is a coefficient for correcting an influence of the thickness of the SEI film already formed at the time of stating a life test.

[Equation 16]

$$Q(t) = Q_{max,ini} \times (1 - \sqrt{k \times t + \alpha}) \qquad (16)$$

As illustrated in FIG. 7, in a case where the battery capacity is predicted on the basis of the conventional root-t method, the capacity prediction error tends to increase as the final reduced capacity of the entire period increases.

Figure 8:
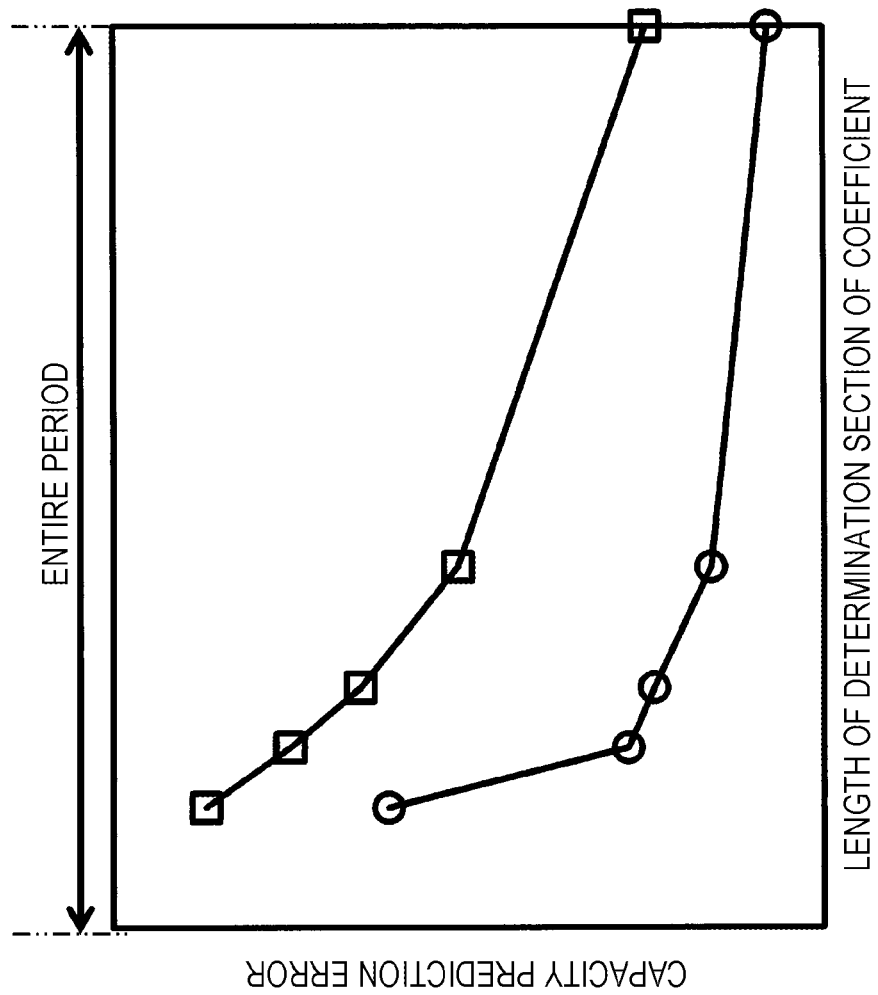
FIG. 8 is a graph illustrating a relation between a length of coefficient determining period and a capacity prediction error.

FIG. 8 is a graph illustrating a relation between the length of the determination period of the coefficient and the capacity prediction error. A circle plot in FIG. 8 represents the capacity prediction error with respect to the capacity degradation function of Equation (15) according to the invention, and a rectangular plot represents the capacity prediction error with respect to the capacity degradation function of Equation (16) according to the conventional root-t method.

As can be seen from FIG. 8, the capacity prediction error become small as the length of the determination period of the coefficient becomes large in any case where the battery capacity is predicted by the capacity degradation function of Equation (15) according to the invention and by the capacity degradation function of Equation (16) according to the conventional root-t method. However, the magnitude of the capacity prediction error in the capacity degradation function of Equation (15) according to the invention is smaller than that in the capacity degradation function of Equation (16) according to the conventional root-t method as long as the length of the determination period of the coefficient is the same. In other words, the capacity prediction accuracy is higher in the capacity degradation function of Equation (15) according to the invention more than that in the capacity degradation function of Equation (16) according to the conventional root-t method.

Basic Data for Life Prediction

In the battery system 100 of this embodiment, basic data for predicting the life span of the single battery 111 (that is, the temporal change of the battery capacity) is stored in the memory unit 180 in advance. The basic data for the prediction of the temporal change of the battery capacity of each single battery 111 includes the capacity degradation function of Equation (15) and information on the coefficients A and τ.

Further, the information on the coefficients A and τ previously stored in the memory unit 180 is obtained in advance as described below. First, a life test is performed on a plurality of test conditions in which the load parameters such as a current pattern I(t), an ambient temperature T(t), and an SOC operational range SOC(t) are combined. At that time, the battery capacity is measured at an appropriate time interval to obtain plot data indicating a relation between a life-test elapse time according to the load parameter and the battery capacity. At this time, a load pattern of the test condition comes to be always constant with respect to the life-test elapse time, or comes to be periodic. Then, the coefficients A and τ are determined by performing a fitting such that the entire test period is set to the determination period of the coefficient with respect to the life test data for each test condition. At this time, the coefficient A is fitted such that the coefficient does not vary even though the load parameter (temperature, SOC, current, etc.) is changed, and becomes the same value as long as the battery specification is the same. In addition, the coefficient τ becomes different values when the load parameter (temperature, SOC, current, etc.) is different.

The coefficients τ corresponding to these test conditions are defined as the following function in the relation with respect to the load parameter for example, and the function is stored in the memory unit 180 as information on the coefficient τ. In addition, the coefficient A is stored in the memory unit 180 in advance as a unique value for each battery.

[Equation 17]

$$A = \text{constant} \qquad (17)$$

[Equation 18]

$$\tau(t) = f\tau(I(t), T(t), SOC(t)) \qquad (18)$$

[Equation 19]

$$\int \frac{dt}{\tau(t)} = -\ln\left(1 - \frac{X(t)}{A}\right) - \frac{X(t)}{A} \qquad (19)$$

The battery pack control unit 150 calculates τ(t) on the basis of a history of the respective load parameters such as the current flowing to each single battery 111, the ambient temperature and the SOC, and Equation (18) described above at every calculation step. Then, the cumulated deterioration amount corresponding to the left side of Equation (19) is calculated using the calculated coefficient τ(t), and stored in the memory unit 180. Thereafter, X(t) is obtained from the cumulated deterioration amount and Equation (19). The temporal change of the battery capacity of each single battery 111 is calculated from the obtained X(t) and Equation (11). Equation (19) is an equation obtained by deforming Equation (15) to correspond to the change of the load parameter. The temporal change of the battery capacity of the single battery 111 of which the left side τ of Equation (19) is calculated (that is, information of the prediction result of the lift of the single battery 111) is stored, for example, in the memory unit 180 as described above. The information of the prediction result of the life of each single battery 111 stored in the memory unit 180 is read, for example, through the battery pack control unit 150 and the vehicle control unit 200 as described above, and displayed in the display device (not illustrated) mounted in the vehicle.

Flowchart

Figure 9:
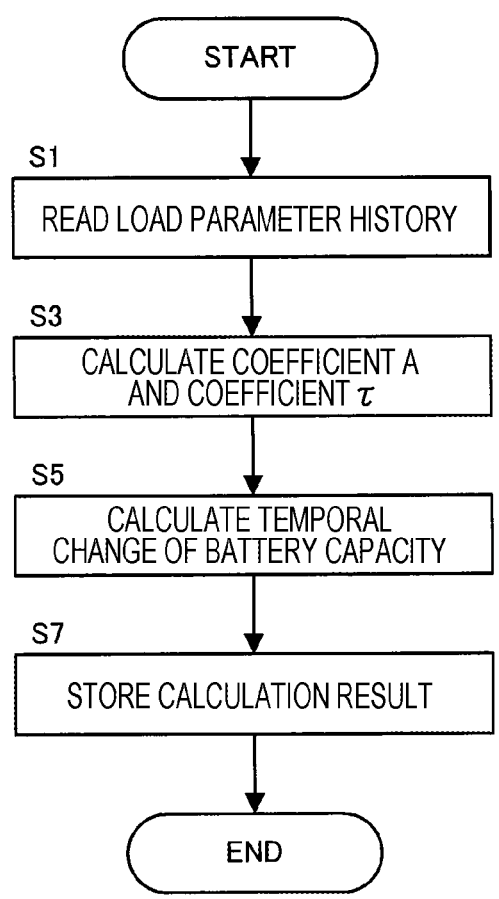
FIG. 9 is a flowchart illustrating an operation of a prediction process of the temporal change of the battery capacity of each single battery.

FIG. 9 is a flowchart illustrating an operation of a prediction process of the temporal change of the battery capacity of each single battery 111. For example, when a trigger for performing the prediction process of the temporal change of the battery capacity is input to the battery pack control unit 150, a program for performing the process illustrated in FIG. 9 is activated and executed by the battery pack control unit 150. Further, for example, in a case where the prediction process of the temporal change of the battery capacity is set in advance to be performed at every several weeks, the trigger for performing the prediction process of the temporal change of the battery capacity is input to the battery pack control unit 150 when it comes to the time for performing the prediction process. In addition, the trigger for performing the prediction process of the temporal change of the battery capacity may be configured to be input to the battery pack control unit 150 when any operation is made to perform the prediction process of the temporal change of the battery capacity.

In Step S1, a history of the respective load parameters such as the current flowing to each single battery 111, the ambient temperature, and the SOC stored in the memory unit 180 is read, and the procedure proceeds to Step S3. In Step S3, the coefficients A and τ are calculated on the basis of the history of the respective load parameters such as the current flowing to each single battery 111, the ambient temperature, and the SOC read in Step S1, and Equations (17) and (18), and the procedure proceeds to Step S5.

In Step S5, the temporal change of the battery capacity of each single battery 111 is calculated on the basis of the coefficients A and τ calculated in Step S3 and the capacity degradation function of Equation (15), and the procedure proceeds to Step S7. In Step S7, the information of the temporal change of the battery capacity of each single battery 111 calculated in Step S5 is stored in the memory unit 180, and the program is ended. Further, in Step S7, the information of the temporal change of the battery capacity of each single battery 111 calculated in Step S5 is, for example, displayed in the display device (not illustrated) of the vehicle in which the battery system 100 is mounted.

In the battery system 100 of this embodiment, the following operational effects can be obtained.

(1) The temporal change of the battery capacity is predicted on the basis of a function in which a reduction of the SEI precursor concentration g(t) in the electrolytic solution by growing the SEI film is taken into consideration. Therefore, the prediction accuracy of the temporal change of the battery capacity can be improved compared to a case where the temporal change of the battery capacity is predicted on the basis of the conventional root-t method in which the reduction of the SEI precursor concentration g(t) in the electrolytic solution by growing the SEI film is not taken into consideration. Therefore, since the life space of each single battery 111 in the battery system 100 used over a long period of time can be predicted with accuracy, it is advantageous in using the battery system 100 stably over a long period of time.

(2) There is provided a physical model in which the battery capacity is lowered in proportion to an increase in thickness of the SEI film formed in the surface of the negative electrode, in which the growth speed of the film thickness is in proportion to the SEI precursor concentration in the electrolytic solution and is in inverse proportion to the film thickness. A function for predicting the temporal change of the battery capacity is derived on the basis of the physical model in which the SEI precursor concentration in the electrolytic solution is reduced as the thickness of the SEI film is increased. Therefore, the prediction function of the temporal change of the battery capacity is derived on the basis of the physical model in which an influence of the SEI film onto the battery capacity is more reflected, so that the prediction curve of the battery capacity can be calculated even when a period of measuring the battery capacity is short. Accordingly, it is advantageous in developing and using the lithium-ion secondary battery.

(3) The prediction function of the temporal change of the battery capacity is expressed by Equations (11) and (19) described above, so that the temporal change of the battery capacity is easy to calculate. Therefore, a calculation load on the battery pack control unit 150 is suppressed when the temporal change of the battery capacity is predicted, so that there is no need about a high-performance arithmetic device, and the cost-up in the battery system 100 can be suppressed.

(4) The coefficients A and τ are determined on the basis of the relation with respect to the load parameters such as the current pattern I(t), the ambient temperature T(t), and the SOC operational range SOC(t), and the temporal change of the battery capacity is calculated. Therefore, the life span of the single battery 111 can be predicted with accuracy in accordance with a usage environment of the battery system 100, so that a replace timing of the battery pack 110 can be optimized, and the battery pack 110 can be efficiently used.

Second Embodiment

In a second embodiment, the description will be made about an example in which the invention is applied to the prediction of the temporal change of the battery capacity when a lithium-ion secondary battery is developed.

When the lithium-ion secondary battery is developed, it is cumbersome to measure the temporal change of the battery capacity on a predetermined load condition over a long period of time. However, as described in the first embodiment, it can be seen that the prediction curve of the battery capacity is well matched to the measured value of the capacity over the entire evaluation period with the accuracy of the battery capacity prediction even when the coefficients A and τ are determined on the basis of the data of the measured value in a short period of time.

In other words, it is possible to significantly shorten a period required for the evaluation test of the temporal change of the battery capacity by applying the invention to the development of the lithium-ion secondary battery.

Figure 10:
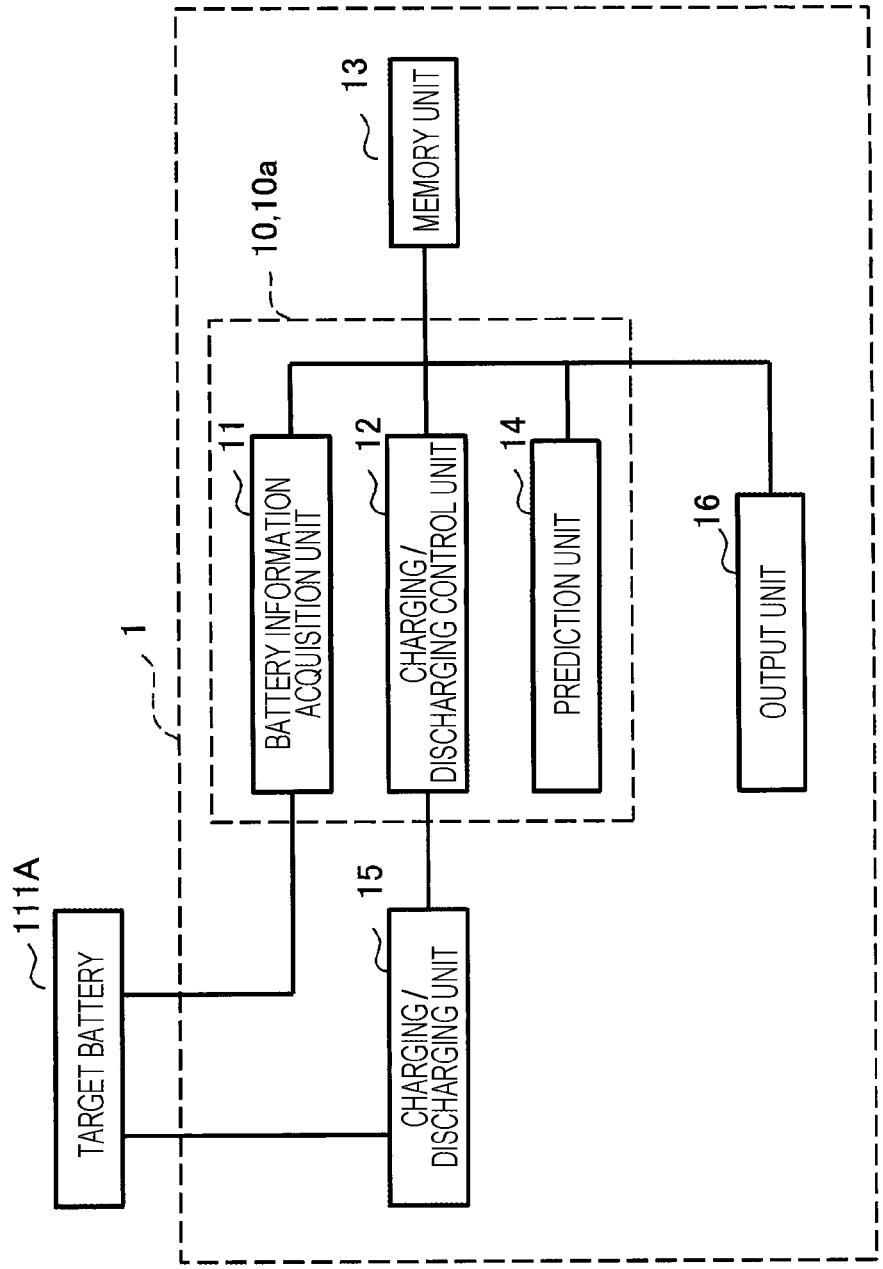
FIG. 10 is a diagram illustrating a configuration of a device in a case where the invention is applied to an evaluation test device of the temporal change of the battery capacity.

FIG. 10 is a diagram illustrating a configuration of the device in a case where the invention is applied to an evaluation test device of the temporal change of the battery capacity. An evaluation test device 1 of this embodiment is a test device which predicts the temporal change of the battery capacity of a target battery 111A on the basis of data of the measured value in a short period of time, and includes a battery information acquisition unit 11, a charging/discharging control unit 12, a memory unit 13, a prediction unit 14, a charging/discharging unit 15, and an output unit 16. The functions of the battery information acquisition unit 11, the charging/discharging control unit 12, and the prediction unit 14 are realized by a CPU 10a of a control circuit 10 when a predetermined program stored in the memory unit 13 is executed.

The battery information acquisition unit 11 is a functional block which detects a state of the target battery 111A such as a voltage, a temperature, and a battery capacity of the target battery 111A and acquires the state as the information of the target battery 111A. For example, the information of the voltage and the temperature of the target battery 111A acquired by the battery information acquisition unit 11 is transmitted to the charging/discharging control unit 12. For example, the information of the battery capacity of the target battery 111A acquired by the battery information acquisition unit 11 is stored in the memory unit 13 together with elapsed time since the test starts.

The charging/discharging control unit 12 is a functional block which controls a cycle of charging or discharging the target battery 111A performed by the charging/discharging unit 15. The charging/discharging control unit 12 controls a charging current, a charging time, a discharging current, a discharging time, and a charging/discharging pause time which are the test conditions of the target battery 111A. In addition, the charging/discharging control unit 12 controls the charging/discharging unit 15 to measure the capacity of the target battery 111A during the test of the target battery 111A. The SOC (State of Charge) of the target battery 111A transmitted from the charging/discharging unit 15, and a control state of the charging/discharge are input to the charging/discharging control unit 12. Further, the charging/discharging unit 15 includes a power source and a load for charging/discharging the target battery 111A.

The memory unit 13 is a memory device which stores a control program for controlling the charging/discharging in the charging/discharging control unit 12, a load pattern (charging/discharging pattern) of the evaluation test, a measurement result of the battery capacity from the charging/discharging control unit 12, and a calculation result in the prediction unit 14 described below. Further, the memory unit 13 includes a memory medium such as RAM, ROM, and nonvolatile memory (not illustrated). In addition, the memory unit 13 stores in advance the capacity degradation function of Equation (19) described in the first embodiment.

The prediction unit 14 is a functional block which measures the temporal change of the battery capacity of the target battery 111A on the basis of the capacity degradation function and the measurement result of the battery capacity stored in the memory unit 13. The prediction unit 14 performs a fitting on the measurement result of the battery capacity by the capacity degradation function of Equation (15) to obtain the prediction curve of the temporal change of the battery capacity of the target battery 111A as described above. The information on the temporal change of the battery capacity of the target battery 111A obtained by the prediction unit 14 is output to the output unit 16.

The output unit 16 includes, for example, the display device which displays the information on the temporal change of the battery capacity of the target battery 111A, and an interface which outputs the information on the temporal change of the battery capacity of the target battery 111A to the outside.

In the evaluation test device 1 configured as described above, the evaluation test is performed on the temporal change of the battery capacity of the target battery 111A as described below. When the target battery 111A is connected to the evaluation test device 1 to start the evaluation test, the charging/discharging control unit 12 controls the charging/discharging unit 15 such that the charging/discharging is performed by the target battery 111A according to the charging/discharging pattern stored in advance in the memory unit 13. The charging/discharging of the target battery 111A is repeatedly performed during the period of the evaluation test.

The battery information acquisition unit 11 appropriately measures and acquires the battery capacity of the target battery 111A during the period of the evaluation test. The information of the battery capacity of the target battery 111A acquired by the battery information acquisition unit 11 is stored in the memory unit 13 together with the information of the elapsed time since the test starts as described above. In this way, the battery capacity of the target battery 111A is measured in plural times in an appropriate interval during the test period.

When the charging/discharging and the measuring of the battery capacity are repeatedly performed in a predetermined test period, the prediction unit 14 reads information indicating a relation between the battery capacity of the target battery 111A and the elapsed time since the test starts from the memory unit 13. The information corresponds to the plot data in the determined period of the coefficient in FIG. 5 described above. The prediction unit 14 performs a fitting on the read information indicating the relation between the battery capacity of the target battery 111A and the elapsed time since the test starts such that a square sum of the error of the predicted value by the capacity degradation function of Equation (15) described above is minimized, and determines the coefficients A and $\tau$.

Then, the prediction unit 14 calculates the prediction curve of the battery capacity of the target battery 111A from Equations (15) and (11) using the determined coefficients A and $\tau$. The calculation result of the prediction unit 14 is stored in the memory unit 13, and the values of the coefficients A and $\tau$ and a graph of the prediction curve are output to the display device of the output unit 16.

Flowchart

Figure 11:
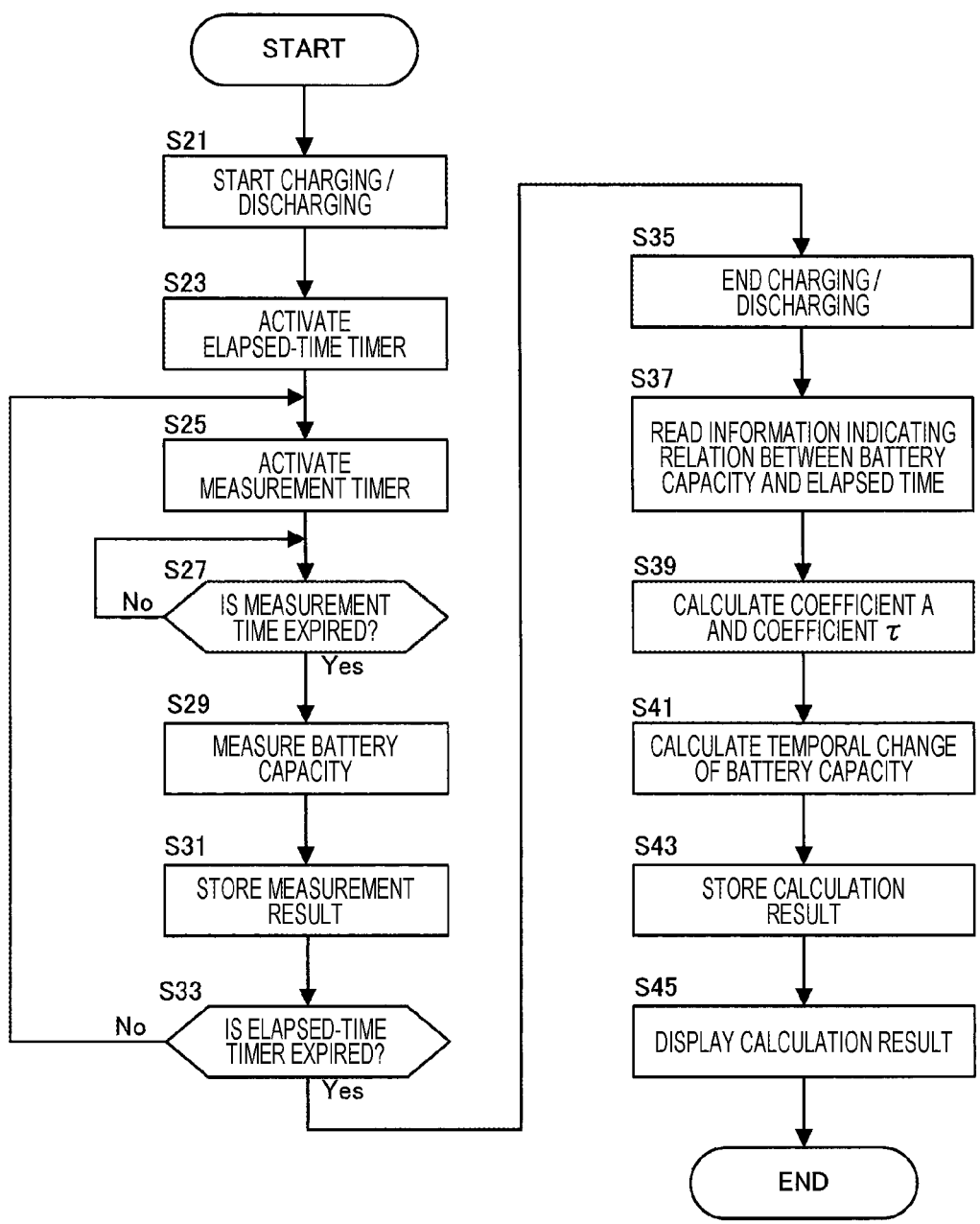
FIG. 11 is a flowchart illustrating an operation of a prediction process of the temporal change of the battery capacity of a target battery in an evaluation test device.

FIG. 11 is a flowchart illustrating an operation of a prediction process of the temporal change of the battery capacity of the target battery 111A in the evaluation test device 1 of this embodiment. For example, when an operation switch (not illustrated) instructing the start of the evaluation test of the temporal change of the battery capacity is operated, a program for performing the process shown in FIG. 11 is activated and executed by the CPU 10a of the control circuit 10. In Step S21, the charging/discharging of the target battery 111A starts on the basis of the load pattern of the evaluation test stored in advance in the memory unit 13, and the procedure proceeds to Step S23.

In Step S23, an elapsed-time timer for counting a test start time is activated, and the procedure proceeds to Step S25. In Step S25, a measurement timer for defining a measurement interval of the battery capacity is activated, and the procedure proceeds to Step S27. In Step S27, the measurement time activated in Step S25 is on standby until that the timer is expired, and then after the procedure proceeds to Step S29. The battery capacity is measured, and the procedure proceeds to Step S31.

In Step S31, the battery capacity measured in Step S29 and the elapsed time of the elapsed-time timer activated in Step S23 are stored in the memory unit 13 in association with each other, and the procedure proceeds to Step S33. In Step S33, it is determined whether the elapsed-time timer activated in Step S23 is expired.

When it is determined that the elapsed-time timer is not expired in Step S33, the procedure proceeds to Step S25. When it is determined that the elapsed-time timer is expired in Step S33, the procedure proceeds to Step S35. The charging/discharging of the target battery 111A started in Step S21 is stopped, and the procedure proceeds to Step S37.

In Step S37, information indicating a relation between the battery capacity and the elapsed time of the elapsed-time timer stored in the memory unit 13 in Step S31 repeatedly executed is read from the memory unit 13, and the procedure proceeds to Step S39. In Step S39, the coefficients A and τ are determined as described above on the basis of the information indicating the relation between the battery capacity and the elapsed time of the elapsed-time timer read in Step S37, and the procedure proceeds to Step S41.

In Step S41, using the coefficients A and τ determined in Step S39, the prediction curve of the battery capacity with respect to the target battery 111A (that is, the temporal change of the battery capacity) is calculated from Equations (15) and (11) stored in the memory unit 13, and the procedure proceeds to Step S43. In Step S43, the prediction curve of the battery capacity calculated in Step S41 and the coefficients A and τ determined in Step S39 are stored in the memory unit 13, and the procedure proceeds to Step S45.

In Step S45, the information of the prediction curve of the battery capacity calculated in Step S41 and the information of the coefficients A and τ determined in Step S39 are displayed in the display device of the output unit 16, and the program is ended.

In the second embodiment, the following operational effects can be obtained in addition to the operational effects of the first embodiment. In other words, the battery capacity is measured while repeatedly performing the charging/discharging of the target battery 111A, and the coefficients A and τ are determined on the basis of the information indicating the relation between the obtained battery capacity and the elapsed time since the test starts. Then, the prediction curve of the battery capacity with respect to the target battery 111A is calculated from Equations (15) and (11) using the determined coefficients A and τ. In this way, even when a period for measuring and acquiring the battery capacity is short, the accurate prediction curve of the battery capacity is obtained. Therefore, it is possible to significantly shorten the period required for the evaluation test of the temporal change of the battery capacity.

Modifications (1) In the first embodiment described above, the information on the coefficients A and τ is stored in the memory unit 180 as a function shown in Equations (17) and (18), but the invention is not limited thereto. For example, the information on the coefficients A and τ may be stored in the memory unit 180 as a data table in association with the test condition performed in advance. Then, when the temporal change of the battery capacity of each single battery 111 is calculated, the coefficients A and τ may be calculated on the basis of the history of the respective load parameters such as the current flowing to each single battery 111, the ambient temperature, and the SOC stored in the memory unit 180, and the above-described data table.

(2) In the first embodiment described above, the coefficients A and τ are calculated on the basis of the history of the respective load parameters such as the current flowing to each single battery 111, the ambient temperature, and the SOC, and Equations (17) and (18) described above. Then, the temporal change of the battery capacity of each single battery 111 is calculated by the capacity degradation function of Equation (19) using the calculated coefficients A and τ, but the invention is not limited thereto. For example, the invention may be applied to the prediction of the temporal change of the capacity of the target battery 111A in an unexecuted-test condition.

Specifically, for example, behavior of the respective load parameters of the target battery 111A corresponding to the unexecuted-test condition are determined in advance. Then, the coefficients A and τ are calculated by applying the behavior of the respective determined load parameters to Equations (17) and (18) described above in place of the history of the respective load parameters such as the current flowing to each single battery 111, the ambient temperature, and the SOC. The temporal change of the battery capacity of the target battery 111A corresponding to the unexecuted-test condition can be calculated from the capacity degradation function of Equation (19) by using the coefficients A and τ calculated as described above.

(3) The above-described embodiments and the modifications may be combined to each other.

The invention is not limited to the above-described embodiments and the modifications, and it is a matter of course that various changes can be made in a scope not departing from the spirit of the invention.

In addition, some or all of the above-described configurations and functions may be realized as hardware using an integrated circuit, or may be realized as a program or software executed by a processor. Information such as programs and tables for realizing the respective functions may be stored in a storage medium such as a memory and a hard disk, or a storage medium such as an IC card and a DVD.

The disclosed contents of the following priority is incorporated herein as a basic application. Japanese Patent Application No. 2014-100741 (filed on May 14, 2014)

REFERENCE SIGNS LIST 1 evaluation test device
10 control circuit
10a CPU
11 battery information acquisition unit
12 charging/discharging control unit
13 memory unit
14 prediction unit
15 charging/discharging unit
16 output unit
100 battery system
110 battery pack
111 single battery (battery cell)
111A target battery
120 battery control system
150 battery pack control unit
180 memory unit

The invention claimed is:

1. A secondary-battery monitoring device that improves accuracy of measuring deterioration in a secondary-battery, comprising:
   a sensor that detects a temperature of the secondary-battery;
   a memory that stores a transition of a load parameter indicating a use state of a secondary battery; and
   a processor that is communicatively coupled with the sensor and the memory, wherein the processor is configured to:
   perform a first life test on the secondary battery to determine a capacity of the secondary battery over a plurality of time intervals for a plurality of test conditions for which load parameters are varied,
   generate a plot of the capacity of the secondary battery for the plurality of test conditions, wherein the plot combines the capacity of each of the load parameters determined for the plurality of time intervals, determines a coefficient A by fitting a first curve to the plot, wherein the coefficient A is fit so that the coefficient A is independent of the load parameters, determines coefficients τ by fitting a second curve to the plot for each of the load parameters, wherein the coefficients τ are dependent on the load parameters, stores the coefficient A and the coefficients τ in the memory, receive the temperature of the battery from the sensor, and predict, using a prediction function, a temporal change of a battery capacity of the secondary battery based on the temperature of the battery received form the sensor and the coefficient A and the coefficients τ stored in the memory, wherein the prediction function is a function derived from a relation between a growth of a film which is formed in an electrode surface of the secondary battery, and a reduction of a precursor component of the film which is contained in an electrolyte of the secondary battery, and wherein the prediction function is expressed as follows:

$$Q(t) = Q_{max,ini} - Q_{max,ini} * X(t);$$

where Q(t) is a predicted battery capacity of the secondary battery, $Q_{max,ini}$ is an initial capacity of the secondary battery and X(t) satisfies:

$$\frac{t}{\tau} = -\ln\left(1 - \frac{X(t)}{A}\right) - \frac{X(t)}{A}$$

where a particular value of τ is retrieved from the memory based on the temperature of the battery received from the sensor.

2. The secondary-battery monitoring device according to claim 1, wherein the load parameter includes at least one of a temperature of the secondary battery, a state of charge (SOC) of the secondary battery, a voltage of the secondary battery, and a current flowing to the secondary battery.

3. The secondary-battery monitoring device according to claim 1, further comprising:

a battery capacity detection device that detects the battery capacity of the secondary battery; and a counting device that counts a use time of the secondary battery, wherein the memory further stores, as a transition of the load parameter, a relation between the battery capacity of the secondary battery detected by the battery capacity detection device and the use time of the secondary battery counted by the counting device.

4. A prediction method of a battery capacity of a secondary-battery that improves accuracy of measuring deterioration in the secondary-battery, comprising:

performing, by a processor, a first life test on the secondary battery to determine a capacity of the secondary battery over a plurality of time intervals for a plurality of test conditions for which load parameters are varied;

generating, by the processor, a plot of the capacity of the secondary battery for the plurality of test conditions, wherein the plot combines the capacity of each of the load parameters determined for the plurality of time intervals, determining, by the processor, a coefficient A by fitting a first curve to the plot, wherein the coefficient A is fit so that the coefficient A is independent of the load parameters, determining, by the processor, coefficients τ by fitting a second curve to the plot for each of the load parameters, wherein the coefficients τ are dependent on the load parameters, storing, by the processor, the coefficient A and the coefficients τ in a memory, receiving, by the processor a temperature of the secondary-battery measured by a sensor; and predicting, using a prediction function, a temporal change of a battery capacity of the secondary battery based on the temperature of the battery received form the sensor and the coefficient A and the coefficients τ stored in the memory wherein the prediction function is a function derived from a relation between a growth of a film formed in an electrode surface of the secondary battery and a reduction of a precursor of the film contained in an electrolyte of the secondary battery;

wherein the prediction function is expressed as follows:

$$Q(t) = Q_{max,ini} - Q_{max,ini} * X(t)$$

where Q(t) is a predicted battery capacity of the secondary battery, $Q_{max,ini}$ is an initial capacity of the secondary battery, and X(t) satisfies:

$$\frac{t}{\tau} = -\ln\left(1 - \frac{X(t)}{A}\right) - \frac{X(t)}{A}$$

where a particular value of τ is retrieved from the memory based on the temperature of the battery received from the sensor.

5. The prediction method of the battery capacity of the secondary battery according to claim 4, further comprising:

detecting the battery capacity of the secondary battery;

counting a use time of the secondary battery; and using a relation between the detected battery capacity of the secondary battery and the use time of the secondary battery as a transition of the load parameter.

* * * * *